United States Patent
Bimberg et al.

(10) Patent No.: US 11,340,677 B2
(45) Date of Patent: May 24, 2022

(54) DATA STORAGE DEVICE POWER MONITORING

(71) Applicant: Seagate Technology LLC, Cupertino, CA (US)

(72) Inventors: Darrel R. Bimberg, Watertown, MN (US); Paul W. Burnett, Savage, MN (US); Christopher L. Hill, Apple Valley, MN (US)

(73) Assignee: Seagate Technology LLC, Fremont, CA (US)

( * ) Notice: Subject to any disclaimer, the term of this patent is extended or adjusted under 35 U.S.C. 154(b) by 47 days.

(21) Appl. No.: 16/778,178

(22) Filed: Jan. 31, 2020

(65) Prior Publication Data

US 2021/0240243 A1    Aug. 5, 2021

(51) Int. Cl.
  *G06F 1/26*     (2006.01)
  *G06F 1/28*     (2006.01)
  *G11B 20/18*    (2006.01)
  *H05K 7/14*     (2006.01)

(52) U.S. Cl.
  CPC ............... *G06F 1/28* (2013.01); *G06F 1/266* (2013.01); *G11B 20/1866* (2013.01); *H05K 7/1494* (2013.01)

(58) Field of Classification Search
  CPC .............................. G06F 1/28; H05K 7/1494
  See application file for complete search history.

(56) References Cited

U.S. PATENT DOCUMENTS

| | | | |
|---|---|---|---|
| 5,181,169 A | 1/1993 | Murugan | |
| 5,998,885 A | 12/1999 | Tamor et al. | |
| 6,320,358 B2 | 11/2001 | Miller | |
| 6,344,985 B1 | 2/2002 | Akerson | |
| 6,496,393 B1 | 12/2002 | Patwardhan | |
| 6,885,173 B2 | 4/2005 | Lee | |
| 7,012,822 B2 | 3/2006 | Zhu et al. | |
| 7,768,254 B1* | 8/2010 | Michael | ............ G06F 1/28 324/142 |
| 7,936,083 B2 | 5/2011 | Stancu et al. | |
| 9,088,175 B2 | 7/2015 | Fang | |
| 9,240,742 B1 | 1/2016 | Erickson et al. | |
| 9,244,519 B1 | 1/2016 | Ellis et al. | |
| 9,690,346 B1 | 6/2017 | Bucher, II | |
| 2004/0189094 A1 | 9/2004 | Hori | |

(Continued)

FOREIGN PATENT DOCUMENTS

| | | |
|---|---|---|
| CN | 110515446 | 11/2019 |
| KR | 10-2018-0126933 | 11/2018 |

OTHER PUBLICATIONS

European Patent Office, Extended European Search Report issued in 20217589.0, dated Jun. 24, 2021.

*Primary Examiner* — Mark A Connolly

(74) *Attorney, Agent, or Firm* — Faegre Drinker Biddle & Reath LLP

(57) ABSTRACT

A data storage device includes an electrical connector configured to receive an input voltage to power electronics of the data storage device. The data storage device further includes a fuse electrically coupled between the electrical connector and the electronics. The fuse is configured to output a signal indicative of current being inputted to the data storage device. The data storage device further includes a controller configured to calculate power based on the input voltage and the signal indicative of the current.

17 Claims, 5 Drawing Sheets

(56) References Cited

U.S. PATENT DOCUMENTS

| | | |
|---|---|---|
| 2005/0135124 A1 | 6/2005 | Diaz Guerra Mora et al. |
| 2006/0250724 A1* | 11/2006 | Hayashi ............. G11B 19/2009 360/69 |
| 2010/0001585 A1 | 1/2010 | Nagata |
| 2012/0262133 A1 | 10/2012 | Martinelli |
| 2013/0046663 A1* | 2/2013 | Antonesei ............. G01R 31/66 705/34 |
| 2013/0047030 A1* | 2/2013 | Soeda ..................... G06F 1/263 714/14 |

* cited by examiner

DATA STORAGE DEVICE POWER MONITORING

SUMMARY

In certain embodiments, a data storage device includes an electrical connector configured to receive an input voltage to power electronics of the data storage device. The data storage device further includes a fuse electrically coupled between the electrical connector and the electronics. The fuse is configured to output a signal indicative of current being inputted to the data storage device. The data storage device further includes a controller configured to calculate power based on the input voltage and the signal indicative of the current.

In certain embodiments, a method is disclosed. The method includes receiving, by an electrical connector, an input voltage to power electronics of a data storage device. The method further includes receiving, by a fuse electrically coupled between the electrical connector and the electronics, the input voltage. The method further includes outputting, by the fuse and based on the input voltage received by the fuse, a signal indicative of current being inputted to the data storage device. The method further includes calculating, by a controller, power based on the input voltage and the signal indicative of the current.

In certain embodiments, circuitry comprising includes an electronic fuse, an analog-to-digital converter, and a system-on-a-chip ("SOC"). The electronic fuse is configured to receive at least two input voltage signals and output an analog signal indicative of a current being inputted to a data storage device from at least one of the at least two input voltage signals. The analog-to-digital converter is electrically coupled between the electronic fuse and the SOC and configured to convert the signal indicative of the current from the analog signal to a digital signal. The SOC is configured to calculate a power based on one of the at least two input voltage signals and the digital signal indicative of the current.

While multiple embodiments are disclosed, still other embodiments of the present invention will become apparent to those skilled in the art from the following detailed description, which shows and describes illustrative embodiments of the invention. Accordingly, the drawings and detailed description are to be regarded as illustrative in nature and not restrictive.

Figure 1:
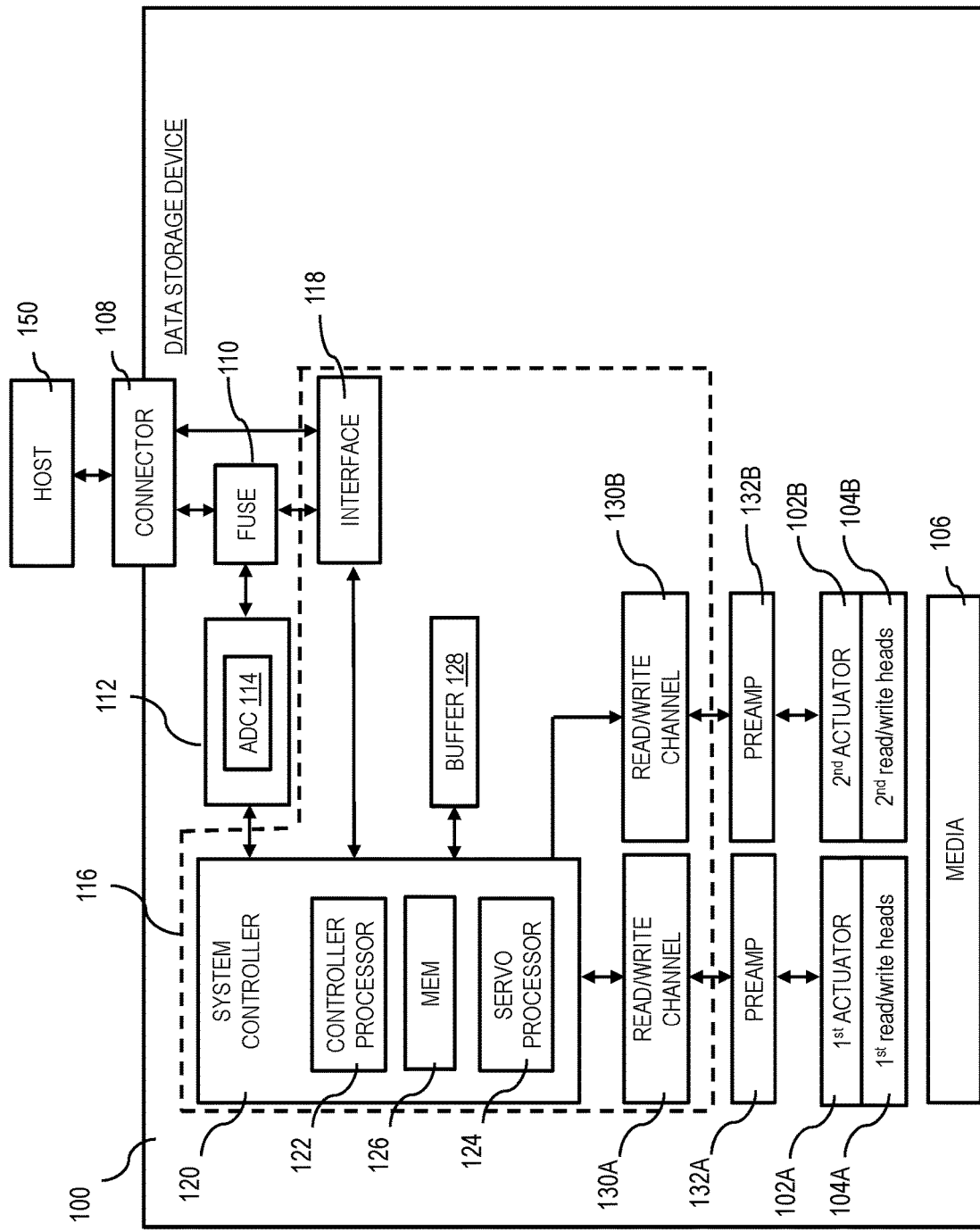
FIG. 1 shows a simplified schematic of a data storage device, in accordance with certain embodiments of the present disclosure.

While the disclosure is amenable to various modifications and alternative forms, specific embodiments have been shown by way of example in the drawings and are described in detail below. The intention, however, is not to limit the disclosure to the particular embodiments described but instead is intended to cover all modifications, equivalents, and alternatives falling within the scope of the appended claims.

DETAILED DESCRIPTION

The present disclosure describes systems, methods, and devices for monitoring power use in data storage devices. Currently, to measure how much power data storage devices are using, data storage devices are connected to an external tool such as a multi-meter or oscilloscope. Certain embodiments of the present disclosure describe approaches for monitoring power of data storage devices using hardware of the data storage devices themselves.

FIG. 1 shows a schematic of a data storage device 100 (e.g., a hard disk drive) that includes a first actuator 102A and a second actuator 102B each coupled to one or more read/write heads 104A and 104B to provide concurrent access to magnetic recording media 106. In certain embodiments, the multiple actuators 102A and 102B share a common pivot axis and are positioned in a stacked arrangement. In such embodiments, the read/write heads 104A coupled to the first actuator 102A access different surfaces of the magnetic recording media 106 than the read/write heads 104B coupled to the second actuator 102B. In other embodiments, the multiple actuators 102A and 102B have separate pivot axes. In such embodiments, the read/write heads 104A coupled to the first actuator 102A may access the same magnetic recording media 106 as the read/write heads 104B coupled to the second actuator 102B. Although two actuators for the data storage device 100 are shown in FIG. 1, in certain embodiments the data storage device 100 may have a single actuator or more than two actuators.

The data storage device 100 includes an electrical connector 108 such as standardized electrical connectors (e.g., Serial Advanced Technology Attachment (SATA) electrical connector or a Serial Attached Small Computer System Interface (SAS) electrical connector). The electrical connector 108 can include various pins to communicate electrical signals between the data storage device 100 and a host 150 (e.g., a server, laptop).

The data storage device 100 also includes a fuse 110. The fuse 110 is electrically coupled between the electrical connector 108 and the rest of the electronics of the data storage device 100. The fuse 110 can be used to help prevent power from undesirably entering the data storage device 100 or leaking from the data storage device 100. For example, the electronics of the data storage device 100 may not be designed to handle low voltage levels. As such, the fuse 110 can help prevent voltage from flowing to the data storage device's electronics until the power reaches a certain threshold. This function can be helpful when power begins to ramp up when the data storage device 100 is initially turned on. As another example, in the event of a power loss of the data storage device 100, the fuse 110 can help prevent power within the data storage device 100 (e.g., power intended for emergency caching data or retracting an actuator in a hard disk drive) from leaking out of the data storage device 100 via the electrical connector 108. In certain embodiments, the fuse 110 is an electronic fuse (sometimes referred to as an eFuse), which is an integrated circuit with circuitry for carrying out the above-described functions. In certain embodiments, the fuse 110 can be programmable such that the threshold (e.g., a voltage level threshold) at which it permits power to flow to electronics can be modified. In certain embodiments, the fuse 110 is only coupled to pins of the electrical connector 108 that output power signals. For example, data commands and data-transferring signals may not pass through the fuse 110 and instead may be communicated directly between the electrical connector 108 and an input/output interface of the data storage device 100.

The data storage device 100 also includes a power device 112 that includes an analog-to-digital converter 114. The power device 112 is electrically coupled between the fuse 110 and a system on a chip ("SOC") 116 (shown in dashed lines in FIG. 1). As will be described in more detail below, the analog-to-digital converter 114 converts an analog electrical signal (e.g., a voltage signal) to a digital signal that can be sampled or otherwise used by the SOC 116 and one or more of its components. In addition to having the analog-to-digital converter 114, the power device 112 is configured to help manage power distribution to the various electronics of the data storage device 100 and may include amplifiers, etc.

The SOC 116 may be an integrated circuit such as an application-specific integrated circuit ("ASIC") and field-programmable gate array ("FPGA") that includes instructions for carrying out various functions of the data storage device 100.

The SOC 116 can include an interface 118 (e.g., an input/output interface) for transferring data to and from the data storage device 100. For example, the interface 118, among other features, can be communicatively coupled between the host 150 (e.g., a data storage system such as a server or laptop) and the read/write heads 104A and 104B to facilitate communication between the read/write heads 104A and 104B and the host 150.

The SOC 116 includes a system controller 120 (hereinafter referred to simply as the "controller") with a controller processor 122 (e.g., a microprocessor), a servo processor 124 (e.g., a microprocessor), and memory 126 (e.g., volatile memory such as a dynamic random access memory ("DRAM"), static random access memory ("SRAM"), and the like). In certain embodiments, a separate respective bank of memory is dedicated to the controller processor 122 and to the servo processor 124, although the memory 126 can be shared among processors of the controller 120.

The controller 120 can be coupled to and control access to a buffer 128, which can temporarily store data associated with read commands and write commands. The buffer 128 can be a volatile memory, such as DRAM, SRAM, and the like. Further, the controller 120 can be coupled to respective read/write channels 130A and 130B.

The controller processor 122 is configured to, among other things, manage access to the magnetic recording media 106. For example, the controller processor 122 may manage dataflow operations, manage access to the buffer 128, and control the respective read/write channels 130A and 130B.

The servo processor 124 is configured to, among other things, control operations of the respective first and second actuators 102A and 102B (and any microactuators coupled to the first and second actuators 102A and 102B) such as track seeking operations, track following operations, and track settling operations. In certain embodiments, the servo processor 124 controls operations of respective pre-amplifiers 132A and 132B, which provide signals to the read/write heads 104A and 104B for writing magnetic transitions to the magnetic recording media 106 and receive signals from the read/write heads 104A and 104B in response to detecting magnetic transitions on the magnetic recording media 106.

The controller 120 also controls scheduling of data transfer commands (e.g., read commands or write commands).

During operation, the data storage device 100 receives various data transfer commands from the host 150. A given data transfer command may be directed to a particular actuator (e.g., a read command for data accessible by the first actuator 102A, or a write command to write data to media accessible by the second actuator 102B). Data received from the host 150 can be encoded or otherwise processed by one of the respective read/write channels 130A and 130B and eventually stored to the magnetic recording media 106 via one of the read/write heads 104A or 104B coupled to the respective first actuator 102A and the second actuator 102B. Data associated with a read command may be retrieved from the magnetic recording media 106 and stored the buffer 128. Such data is then transferred to the host 150 by the interface 118 via the controller 120.

The controller 120 is also configured to control operations of the data storage device's spindle motor (not shown). For example, the controller 120 can control the speed of the spindle motor, when the spindle motor spins up and spins down, and different power modes (e.g., power-saving mode) of the spindle motor.

Figure 2:
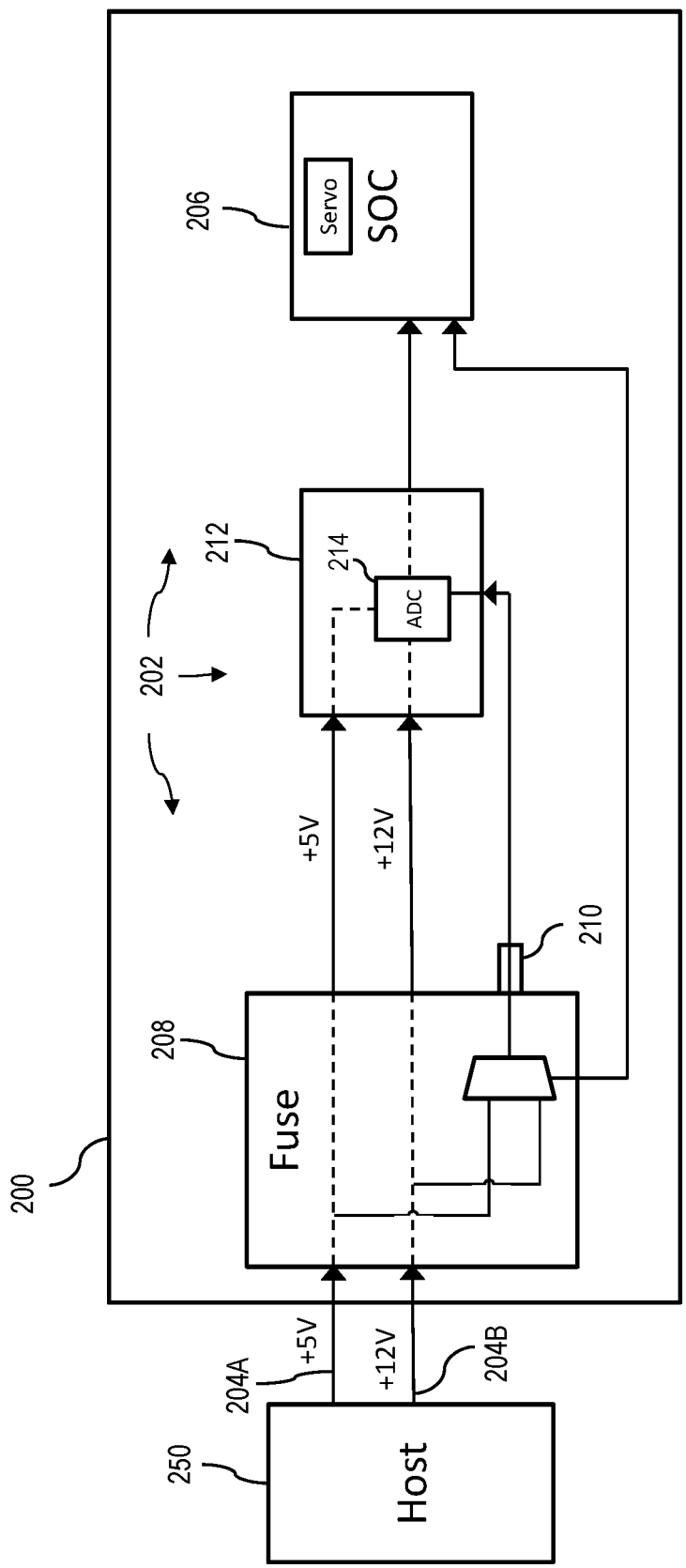
FIG. 2 shows a schematic of a power-monitoring circuit, in accordance with certain embodiments of the present disclosure.

FIG. 2 shows a data storage device 200 with a power-monitoring circuit 202 (hereinafter referred to simply as the "circuit 202") that can be used to calculate the total power usage of the data storage device 200. For simplicity of explanation, the data storage device 200 is not shown in FIG. 2 with all of the features described above with respect to FIG. 1 and vice versa. However, it is appreciated that the data storage device 200 could include each of the features shown and described with respect to FIG. 1 but not necessarily shown in FIG. 2

In short, the circuit 202 includes features for measuring the voltage being inputted to the data storage device 200 and for measuring the current being consumed by the electronics of the data storage device 200. As such, the measured voltage and current can be used to calculate—among other things—the total power being used by the data storage device 200. The calculated power can be communicated to a host 250, which can use the calculated power to manage power usage across data storage devices controlled by the host 250.

The host 250 is shown as providing two power sources (i.e., a first power source 204A and a second power source 204B) to the data storage device 200. In certain embodiments, the two power sources can have different voltages. For example, the first power source 204A can be a 5-volt power source and the second power source 204B can be a 12-volt power source. The first power source 204A can power components of the data storage device 200 such as an SOC 206 and miscellaneous lower-power electronics while the second power source 204B can power components of the data storage device 200 such as the spindle motor, microactuators, and the voice coil motors that rotate actuators coupled to read/write heads.

The signals from both the first power source 204A and the second power source 204B can be inputted to a fuse 208. As mentioned above with respect to the fuse 110 of FIG. 1, the fuse 208 can help prevent low voltage levels from reaching the electronics of the data storage device or power from leaking out of the data storage device 200.

In certain embodiments, the fuse 208 is also configured to output an analog signal that is indicative of the current being used by electronics of the data storage device 200. For example, the outputted analog signal from the fuse 208 can be indicative of the current being used by (or drawn by) the electronics powered by the first power source 204A and by the electronics powered by the second power source 204B.

In certain embodiments, the outputted analog signal has a voltage that is proportional to the current being used by the electronics of the data storage device 200.

In certain embodiments, the fuse 208 shown in FIG. 2 includes only a single output pin 210. As such, the fuse 208 can be arranged to interleave respective signals indicative of the current being used by the electronics powered by the first power source 204A (e.g., from the first input voltage) and by the electronics powered by the second power source 204B (e.g., from the second input voltage). In certain embodiments, the output pin 210 includes or is coupled to a series resistor, which can be used to adjust the gain or scaling of the respective signals indicative of the current being used by the electronics powered by the first power source 204A (e.g., from the first input voltage) and by the electronics powered by the second power source 204B (e.g., from the second input voltage).

In certain embodiments, the analog signal—that is indicative of the current being used by the electronics of the data storage device 200—is outputted from the fuse 208 and inputted to a power device 212. The analog-to-digital converter 214 of the power device 212 can convert the analog signal to a digital signal that can be used by the SOC 206. In certain embodiments, the power device 212 includes a scaling module that scales down the amplitude of the signal being inputted to the SOC 206.

After receiving the digital signal indicative of the current being used by the electronics of the data storage device 200, the SOC 206 uses the digital signal and the input voltage (e.g., 5 volts, 12 volts, or as measured by hardware of the data storage device 200) to calculate the actual power being used by the entire data storage device 200 (e.g., total power used of the data storage device 200). For example, the power can be calculated by multiplying the input voltage by the known current, which is based on the digital signal indicative of the current being consumed by the electronics of the data storage device 200. In certain embodiments, the input voltage is measured by the analog-to-digital converter 214 of the power device 212. In certain embodiments, a controller (e.g., via a servo processor) calculates the power. For example, the servo processor may sample the measured voltages and current from the analog-to-digital converter 214 and then calculate power. The servo processor may—from a control path or signal path perspective—be closest to the analog-to-digital converter 214 compared to other processors of the SOC 206.

As described above, the SOC 206 can calculate the total power being consumed by electronics of the data storage device 200 in real time by sampling the digital signal from the power device 212 and using the sampled or measured input voltages. However, other types of calculations can be made. For example, the SOC 206 can separately calculate the power being consumed by the electronics powered by first power source 204A and the power being consumed by the electronics powered by second power source 204B. The two power calculations can then be added together to calculate the total power usage of the data storage device 200. As another example, the SOC 206 can calculate and timestamp the minimum and maximum power usage. As another example, the SOC 206 can calculate average power usage across a given period of time (e.g., on the order of seconds to minutes to hours) that can initially be predetermined and later adjusted (e.g., internally or by a command from the host 250).

In certain embodiments, the various power calculations can be stored within the data storage device 200. For example, memory can store the results of the various power calculations. In addition, the various power calculations can be formatted for communication to the host 250. For example, the various calculations can be formatted into a log file that is designed for use with the requirements of the host 250. The specific formatting may differ depending on the type and manufacturer of the host 250. In certain embodiments, the host 250 can send the data storage device 200 a command to send the host 250 one or more of the power calculations. In addition, the host 250 can send the data storage device 200 a command to modify how it calculates certain power calculations. For example, the host 250 could request that the data storage device 200 increase or decrease the time period over which the average power is calculated.

Figure 3:
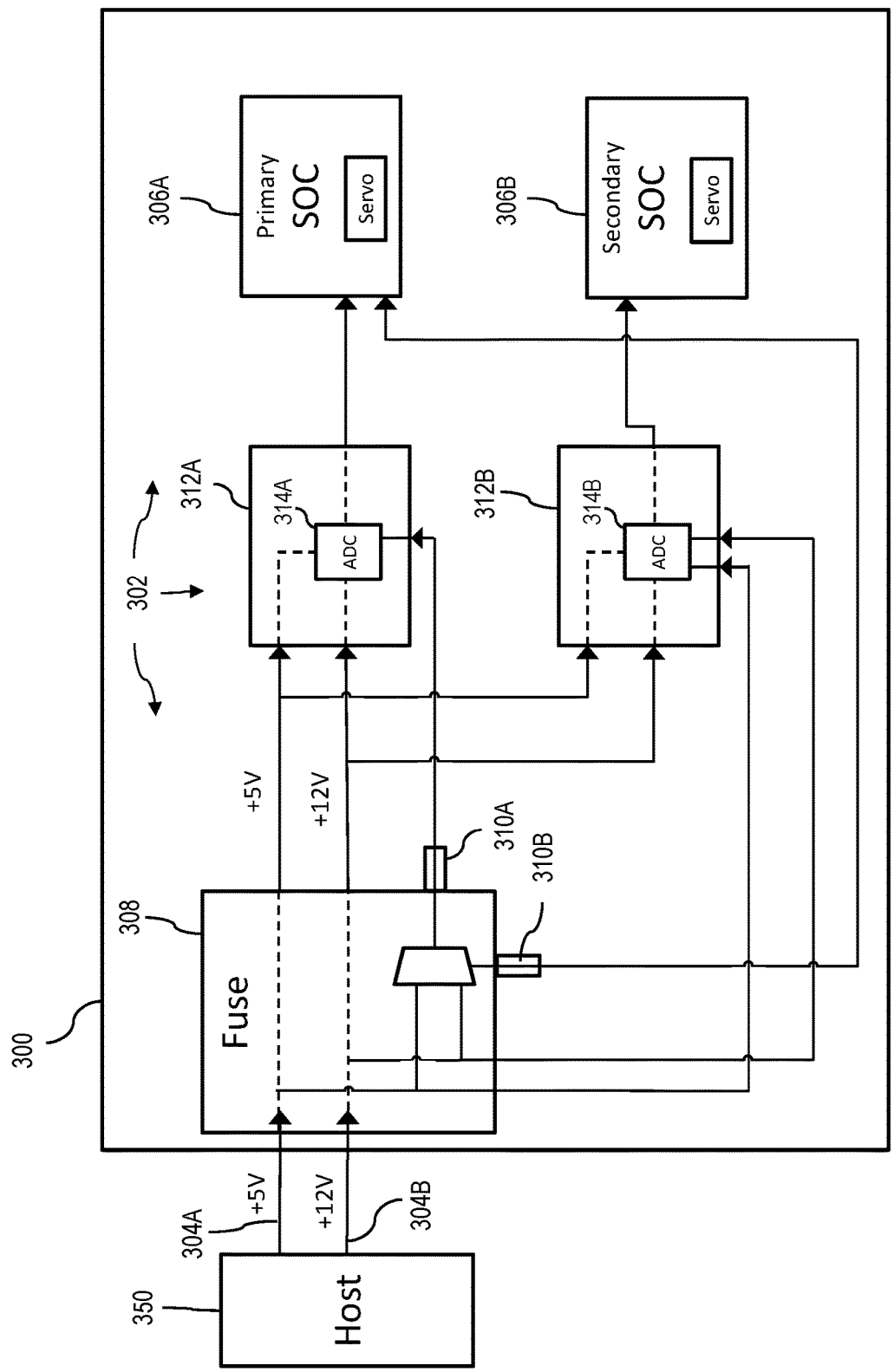
FIG. 3 shows a schematic of another power-monitoring circuit, in accordance with certain embodiments of the present disclosure.

FIG. 3 shows a data storage device 300 with a power-monitoring circuit 302 (hereinafter referred to simply as the "circuit 302") that can be used to calculate the total power usage of the data storage device 300. For simplicity of explanation, the data storage device 300 is not shown in FIG. 3 with all of the features described above with respect to FIG. 1 and vice versa. However, it is appreciated that the data storage device 300 could include each of the features shown and described with respect to FIG. 1 but not necessarily shown in FIG. 3. Similarly to the circuit 202 of FIG. 2, the circuit 302 includes features for measuring the voltage being inputted to the data storage device 300 and for measuring the current being consumed by the electronics of the data storage device 300.

A host 350 is shown as providing two power sources (i.e., a first power source 304A and a second power source 304B) to the data storage device 300. In certain embodiments, the two power sources can have different voltages. For example, the first power source 304A can be a 5-volt power source and the second power source 304B can be a 12-volt power source. The first power source 304A can power components of the data storage device 300 such as first and second SOCs 306A and 306B as well as miscellaneous lower-power electronics while the second power source 304B can power components of the data storage device 300 such as the spindle motor, microactuators, and the voice coil motors that rotate actuators coupled to read/write heads.

The signals from both the first power source 304A and the second power source 304B can be inputted to a fuse 308. As mentioned above with respect to the fuse 110 of FIG. 1, the fuse 308 can help prevent low voltage levels from reaching the electronics of the data storage device or power from leaking out of the data storage device 300.

In certain embodiments, the fuse 308 is also configured to output multiple analog signals that are indicative of the current being used by the electronics of the data storage device 300 that are being powered by the respective first power source 304A and the second power source 304B. In certain embodiments, the outputted analog signal has a voltage that is proportional to the current being used by the electronics of the data storage device 300.

In certain embodiments, the fuse 308 shown in FIG. 3 includes multiple output pins (i.e., a first output pin 310A and a second output pin 310B). The first output pin 310A can be arranged to output a first analog signal indicative of the current being used by the electronics powered by the first power source 304A (e.g., from the first input voltage), and the second output pin 310B can be arranged to output a second analog signal indicative of the current being used by the electronics powered by the second power source 304B (e.g., from the second input voltage). In certain embodiments, the first output pin 310A and the second output pin 310B include or are coupled to respective series resistor, which can be used to adjust the gain or scaling of the respective signals indicative of the current being used by the electronics powered by the first power source 304A (e.g., from the first input voltage) and by the electronics powered by the second power source 304B (e.g., from the second input voltage).

In certain embodiments, the first analog signal—that is indicative of the current being used by the electronics of the data storage device 300 powered by the first power source 304A—is outputted from the fuse 308 and inputted to a first power device 312A. A first analog-to-digital converter 314A of the first power device 312A can convert the analog signal to a first digital signal that can be used by the first SOC 306A. In certain embodiments, the first power device 312A includes a scaling module that scales down the amplitude of the signal being inputted to the first SOC 306A.

In certain embodiments, the second analog signal—that is indicative of the current being used by the electronics of the data storage device 300 powered by the second power source 304B—is outputted from the fuse 308 and inputted to a second power device 312B. A second analog-to-digital converter 314B of the second power device 312B can convert the analog signal to a first digital signal that can be used by the second SOC 306B. In certain embodiments, the second power device 312B includes a scaling module that scales down the amplitude of the signal being inputted to the second SOC 306B. Although the first power device 312A and the second power device 312B are shown are separate devices, they may be incorporated onto a shared chip package but with separate inputs and outputs.

After receiving the first digital signal indicative of the current being used by the electronics of the data storage device 300, the first SOC 306A uses the first digital signal and one of the input voltages to calculate the actual power being used by electronics powered by one of the power sources. Similarly, after receiving the second digital signal indicative of the current being used by the electronics of the data storage device 300, the second SOC 306B uses the second digital signal and the other one of the input voltages to calculate the actual power being used by electronics powered by the other one of the power sources. The two power calculations can be calculated by multiplying the respective known input voltages by the respective known currents, which are based on the digital signals indicative of the current being consumed by the electronics of the data storage device 300. In certain embodiments, a controller via a servo processor calculates the power. Although the first SOC 306A and the second SOC 306B are shown are separate devices, they may be incorporated onto a shared chip package but with separate inputs and outputs.

The first and second SOCs 306A and 306B can calculate the respective power being consumed by electronics of the data storage device 300 in real time by sampling the respective first and second digital signals from the power devices 312A and 312B and using the respective input voltages. The two power calculations can then be added together to calculate the total power usage of the data storage device 300. As noted above, the various power calculations can be stored within the data storage device 300, formatted for communication to the host 350, retrieved by the host 350, and/or modified in response to a command from the host 350.

Figure 4:
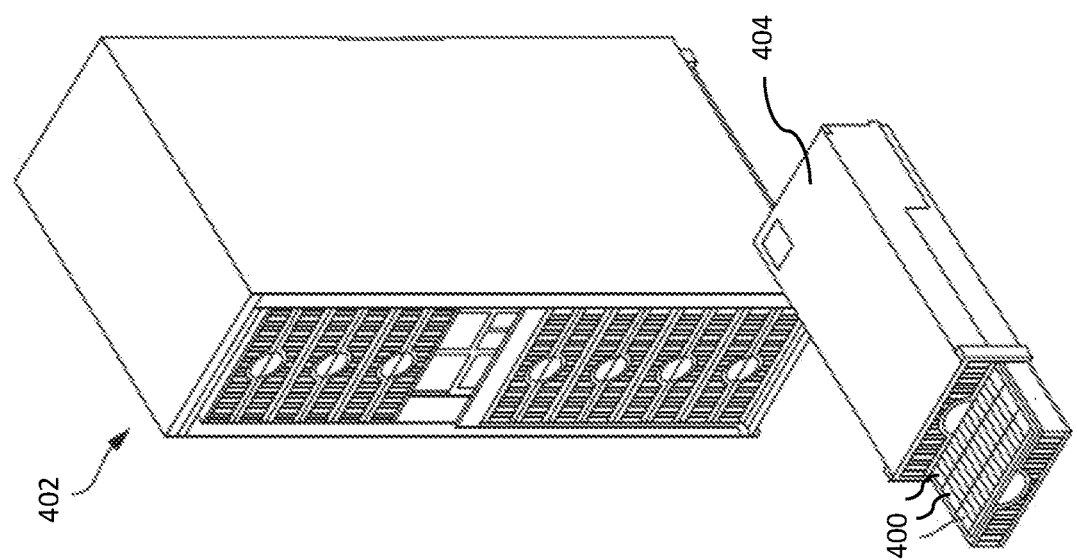
FIG. 4 shows a system including multiple data storage devices, in accordance with certain embodiments of the present disclosure.

FIG. 4 shows a plurality of data storage devices 400 electrically and communicatively coupled to a data storage system 402. For example, the data storage system 402 may be a server with data storage devices 400 such as hard disk drives and/or solid-state drives arranged in enclosures 404. The data storage devices 400 can include circuitry (e.g., the circuit 202 of FIG. 2 or the circuit 302 of FIG. 3) that monitors power usage of the data storage devices 400. The calculated power usage of the various data storage devices 400 can be communicated to the data storage system 402. In response to the calculated power usage, the data storage system 402 can manage how power is distributed to the various data storage devices 400. Further, the data storage system 402 may be one of multiple data storage systems 402 in a data farm or data warehouse. The data storage system 402 can communicate with a power management system of the data farm or data warehouse to manage power usage across each of the data storage systems in the data farm or data warehouse.

Figure 5:
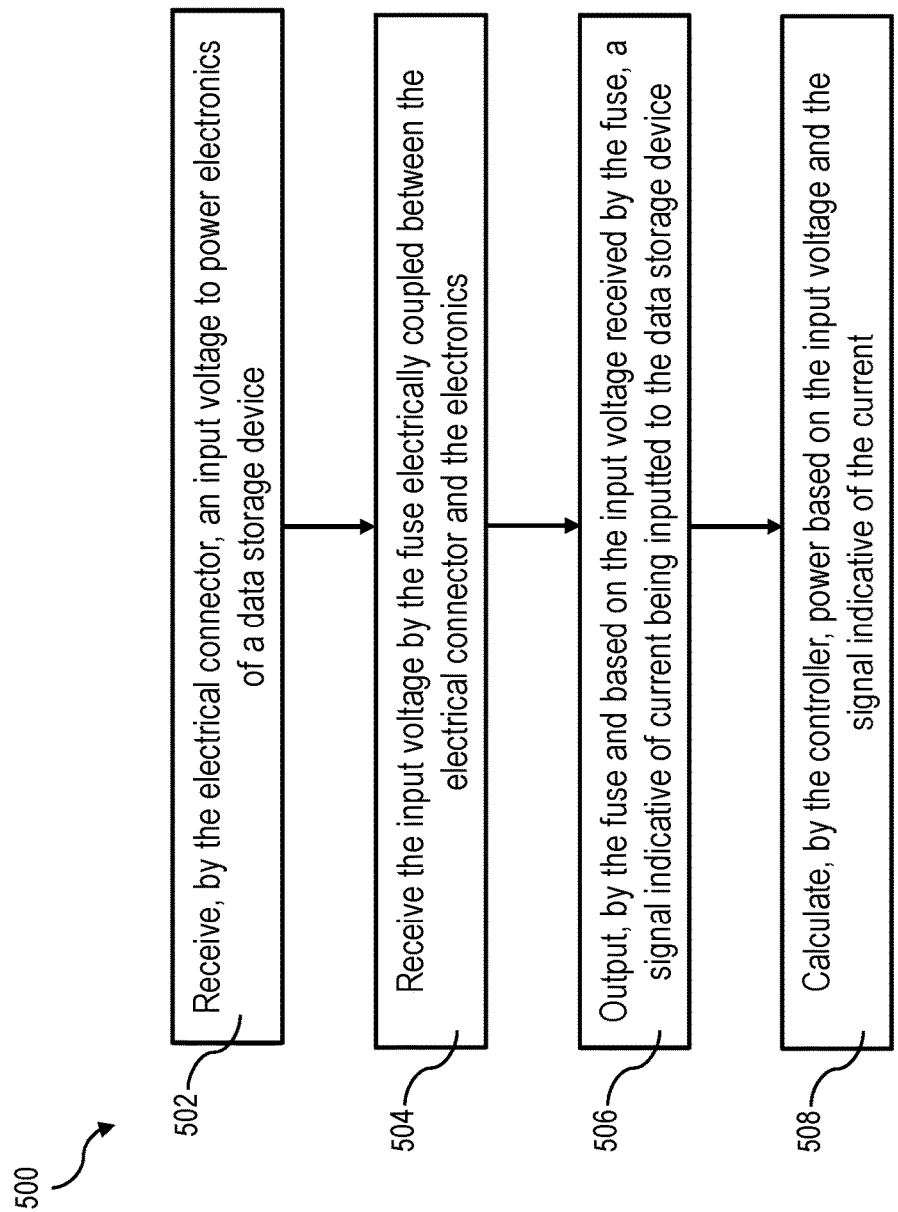
FIG. 5 depicts a block diagram of steps of a method calculating power use of a data storage device, in accordance with certain embodiments of the present disclosure.

FIG. 5 outlines a method 500 for monitoring power of the data storage device 100. The method 500 includes receiving, by the electrical connector 108, an input voltage to power electronics of a data storage device 100 (block 502 in FIG. 5). The method 500 further includes receiving the input voltage by the fuse 110 electrically coupled between the electrical connector 108 and the electronics (block 504 in FIG. 5). The method 500 includes outputting, by the fuse 110 and based on the input voltage received by the fuse 110, a signal indicative of current being inputted to the data storage device 100 (block 506 in FIG. 5). The method also includes calculating, by the controller 120, power based on the input voltage and the signal indicative of the current (block 508 in FIG. 5).

Various modifications and additions can be made to the embodiments disclosed without departing from the scope of this disclosure. For example, while the embodiments described above refer to particular features, the scope of this disclosure also includes embodiments having different combinations of features and embodiments that do not include all of the described features. Accordingly, the scope of the present disclosure is intended to include all such alternatives, modifications, and variations as falling within the scope of the claims, together with all equivalents thereof.

We claim:

1. A data storage device comprising:
an electrical connector configured to receive an input voltage to power electronics of the data storage device;
a fuse electrically coupled between the electrical connector and the electronics and configured to output a signal indicative of current being inputted to the data storage device; and
a power device electrically coupled between the fuse and a controller, the power device comprising an amplifier and configured to manage power distribution to the electronics; and
the controller configured to calculate power based on the input voltage and the signal indicative of the current.

2. The data storage device of claim 1, wherein the signal indicative of the current comprises a voltage that is proportional to the current being inputted to the data storage device.

3. The data storage device of claim 1, wherein the power device includes
an analog-to-digital converter configured to convert the signal indicative of the current from an analog signal to a digital signal.

4. The data storage device of claim 3, wherein the power device is further configured to scale down the digital signal before the digital signal is inputted to the controller.

5. The data storage device of claim 1, wherein the input voltage includes a first input voltage and a second input voltage.

6. The data storage device of claim 5, wherein the signal indicative of the current includes a first signal responsive to the first input voltage and a second signal responsive to the second input voltage, wherein the fuse includes a first output pin arranged to communicate the first signal and a second output pin arranged to communicate the second signal.

7. The data storage device of claim 5, wherein the fuse includes a single output pin arranged to communicate interleaved respective signals indicative of the current being inputted to the data storage device from the first input voltage and from the second input voltage.

8. A method comprising:
receiving, by an electrical connector, an input voltage to power electronics of a data storage device;
receiving, by a fuse electrically coupled between the electrical connector and the electronics, the input voltage;
outputting, by the fuse and based on the input voltage received by the fuse, a signal indicative of current being inputted to the data storage device;
converting, via an analog-to-digital converter electrically coupled between the fuse and the controller, the signal indicative of the current from an analog signal to a digital signal;
scaling down the digital signal before inputting the digital signal to the controller; and
calculating, by a controller, power based on the input voltage and the signal indicative of the current.

9. The method of claim 8, wherein the signal indicative of the current comprises a voltage that is proportional to the current being inputted to the data storage device.

10. The method of claim 8, wherein the input voltage includes a first input voltage and a second input voltage, the method further comprising:
interleaving the signals indicative of the current being inputted to the data storage device from the first input voltage and from the second input voltage; and
receiving, by the controller, the interleaved signals.

11. The method of claim 8, wherein the input voltage includes a first input voltage and a second input voltage, wherein the calculated power includes a first calculated power responsive to the first input voltage and a second calculated power responsive to the second input voltage.

12. The method of claim 8, wherein the calculated power represents the total power consumed by the entire data storage device.

13. The method of claim 8, wherein the calculated power includes an average amount of power over a pre-determined time period.

14. The method of claim 8, further comprising:
storing the calculated power in a log file in the data storage device.

15. The method of claim 14, further comprising:
transmitting the log file to a host communicatively coupled to the data storage device.

16. Circuitry comprising:
an electronic fuse, a first analog-to-digital converter, a first system-on-a-chip ("SOC"), a second analog-to-digital converter, and a second SOC,
the electronic fuse is configured to:
receive at least two input voltage signals and output a first analog signal indicative of a first current being inputted to a data storage device from at least one of the at least two input voltage signals, and
output a second analog signal indicative of second current being inputted to the data storage device from the at least two input voltage signals,
the first analog-to-digital converter is electrically coupled between the electronic fuse and the first SOC and configured to convert the first signal indicative of the first current from the first analog signal to a first digital signal,
the first SOC is configured to calculate a first power based on one of the at least two input voltage signals and the first digital signal indicative of the first current,
the second analog-to-digital converter is electrically coupled between the electronic fuse and the second SOC and configured to convert the second signal indicative of the second current from a second analog signal to a second digital signal, and
the second SOC is configured to calculate a second power based on one of the at least two input voltage signals and the second digital signal indicative of the second current.

17. The circuitry of claim 16, wherein the first analog signal indicative of the first current comprises a first voltage that is proportional to the first current being inputted to the data storage device, wherein the second analog signal indicative of the second current comprises a second voltage that is proportional to the second current being inputted to the data storage device.

* * * * *